(12) United States Patent
Chinthu et al.

(10) Patent No.: US 12,732,099 B2
(45) Date of Patent: Sep. 8, 2026

(54) LOW LEAKAGE CHARGE/DISCHARGE CIRCUIT

(71) Applicant: GlobalFoundries U.S. Inc., Malta, NY (US)

(72) Inventors: Siva Kumar Chinthu, Bangalore (IN); Palle Sundar Veerendranath, Andhra Pradesh (IN); Rajneesh Kumar, Uttar Pradesh (IN); Abdul Rajak, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 22 days.

(21) Appl. No.: 18/945,800

(22) Filed: Nov. 13, 2024

(65) Prior Publication Data

US 2026/0135477 A1 May 14, 2026

(51) Int. Cl.

| | |
|---|---|
| ***H03K 19/00*** | (2006.01) |
| ***G11C 13/00*** | (2006.01) |
| ***H02M 3/07*** | (2006.01) |
| ***H03K 19/0185*** | (2006.01) |

(52) U.S. Cl.

CPC ........... *H02M 3/07* (2013.01); *G11C 13/0038* (2013.01); *H03K 19/018507* (2013.01)

(58) Field of Classification Search

CPC ...... H02M 3/07; G11C 13/0038; G11C 5/145; G11C 5/147; H03K 19/018507

See application file for complete search history.

(56) References Cited

U.S. PATENT DOCUMENTS

| | | | | |
|---|---|---|---|---|
| 5,642,072 | A * | 6/1997 | Miyamoto | G11C 5/145 327/543 |
| 5,818,290 | A * | 10/1998 | Tsukada | G05F 3/205 327/535 |
| 7,706,194 | B2 | 4/2010 | Mori | |
| 8,115,518 | B1 * | 2/2012 | Ali | H03K 17/162 327/91 |
| 8,692,608 | B2 * | 4/2014 | Chen | H02M 3/07 363/60 |
| 9,001,596 | B2 | 4/2015 | Park | |
| 9,641,068 | B2 | 5/2017 | Tanzawa | |

(Continued)

FOREIGN PATENT DOCUMENTS

| | | | |
|---|---|---|---|
| EP | 3657657 | A1 | 5/2020 |

*Primary Examiner* — Tuan T Lam

(74) *Attorney, Agent, or Firm* — Ramakrishnan Parthasarathy; Hoffman Warnick LLC

(57) ABSTRACT

Disclosed is a charge/discharge circuit structure for an output node (e.g., of a device, such as a charge pump in a memory structure, such as in a resistive random access memory (RRAM) structure). The circuit structure includes, among other components: a positive supply voltage node at a positive supply voltage level; a first input node connected to an output node of a device (e.g., a charge pump) to receive a variable output voltage (Vout); and an N-type field effect transistor (NFET) and a first P-type field effect transistor (PFET) connected in series between the positive supply voltage node and the first input node. The gate of the NFET can be connected to the drain region of the first PFET (and thereby also the first input node). Thus, the NFET functions as a source follower NFET switch controlled by feedback from the drain region of the first PFET.

20 Claims, 6 Drawing Sheets

(56) References Cited

U.S. PATENT DOCUMENTS

| | | | | |
|---|---|---|---|---|
| 9,780,674 | B2 | 10/2017 | Freeman et al. | |
| 9,940,029 | B2 | 4/2018 | Kimura et al. | |
| 11,056,155 | B1 | 7/2021 | Trinh et al. | |
| 12,034,368 | B1 * | 7/2024 | Tian .................... | H02M 1/0045 |

* cited by examiner

| | Write Mode HV | Write Mode LV | Read Mode |
|---|---|---|---|
| VDD | 1.8 V | 1.8 V | 1.8 V |
| Vout | 3.6 V | 1.2 V | VDD (e.g., 1.8 V) |
| 1st input node | 3.6 V | 1.2 V | 1.8 V |
| RDen at second input node | 0.0 V | 0.0 V | 1.8 V |
| Vg of PFET1 | 3.6 V | 1.2 V | 0.0 V |
| Vg of PFET2 | 1.8 V | 1.8 V | 0.0 V |
| Vg of NFET | 3.6 V | 1.2 V | 1.8 V |
| PFET1 | OFF | OFF | ON |
| PFET2 | OFF | OFF | ON so current flow through PFET1 and PFET2 maintains Vout charged at 1.8 V |
| NFET | ON but only pulls Vs of PFET1 to 1.8 V, so PFET1 stays OFF | Leaky but only pulls Vs of PFET1 to 1.2 V, so PFET1 stays off | OFF |
| Vj | 1.8 V | 1.2 V | 1.8 V |
| Ij | ~ -15.0 nA | ~550 fA (worst case ~1 pA) | ~10.6 zA |

FIG. 5

LOW LEAKAGE CHARGE/DISCHARGE CIRCUIT

BACKGROUND

The present disclosure relates to charge/discharge circuits and, more particularly, to embodiments of a charge/discharge circuit for the output node of a variable voltage generator (e.g., for the output node of a charge pump of a non-volatile memory (NVM) structure).

An NVM structure, such as a resistive random access memory (RRAM) structure, typically requires a charge pump for generating and outputting an operation-dependent variable output voltage (Vout). To facilitate generation of Vout when switching from one operating mode (which requires Vout to be at a relatively high voltage level) to a different operating mode (which requires Vout to be at a relatively low voltage level or vice versa), the output node of the charge pump can be connected to a charge/discharge circuit. Such charge/discharge circuits may use high voltage transistors (i.e., transistors that are rated for high voltage operation). Alternatively, such charge/discharge circuits may use low voltage transistors (i.e., transistors that are rated for low voltage operation. However, in this case, they tend to exhibit significant leakage depending on the voltage level of Vout and the specific operating mode.

SUMMARY

Disclosed herein are embodiments of a charge/discharge circuit structure (e.g., for a charge pump). In the disclosed embodiments, the structure can include: a positive supply voltage node at a positive supply voltage level and a first input node connected to an output node of a device to receive a variable output voltage. The structure can further include an N-type field effect transistor (NFET) and a first P-type field effect transistor (PFET) connected in series between the positive supply voltage node and the first input node. Additionally, the gate of the NFET can be connected to a drain region of the first PFET.

Some embodiments of the structure can include a positive supply voltage node at a positive supply voltage level and a first input node connected to an output node of a charge pump to receive a variable output voltage. The structure can further include an N-type field effect transistor (NFET) and a first P-type field effect transistor (PFET) connected in series between the positive supply voltage node and the first input node. Additionally, the gate of the NFET can be connected to a drain region of the first PFET. The structure can further include a second PFET connected in parallel with the NFET between the positive supply voltage node and the first PFET. The structure can further include a capacitor connected between the first input node and ground.

Some embodiments of the structure can include: a positive supply voltage node at a positive supply voltage level, a first input node connected by a capacitor to an output node of a charge pump to receive a variable output voltage from the charge pump, and a second input node connected to receive a first enable signal. The structure can further include an N-type field effect transistor (NFET), and a first P-type field effect transistor (PFET) connected in series between the positive supply voltage node and the first input node. Additionally, the gate of the NFET can be connected to a drain region of the first PFET. The structure can further include a second PFET connected in parallel with the NFET between the positive supply voltage node and the first PFET. The structure can further include a capacitor connected between the first input node and ground. The structure can further include a voltage level shifter having two input terminals connected to the first input node and to the second input node, respectively, and an output terminal connected to a gate of the first PFET. The voltage level shifter can be configured to output a level-shifted voltage to the gate of the first PFET based on the variable output voltage and the first enable signal. The structure can further include an inverter connected between the second input node and a gate of the second PFET. The inverter can be configured to output a second enable signal to the gate of the second PFET and this second enable signal can be inverted relative to the first enable signal.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which:

FIGS. 5 and 6 are a table and timing diagram, respectively, each illustrating various electrical properties of an implementation of the structure of FIG. 2.

DETAILED DESCRIPTION

As mentioned above, an NVM structure, such as a resistive random access memory (RRAM) structure, typically requires a charge pump for generating and outputting an operation-dependent variable output voltage (Vout). To facilitate generation of Vout at the desired voltage level when switching from one operating mode (which requires Vout to be at a relatively high voltage level) to a different operating mode (which requires Vout to be at a relatively low voltage level or vice versa), the output node of the charge pump can be connected to a charge/discharge circuit. Such charge/discharge circuits often use high voltage transistors (i.e., transistors that are rated for high voltage operation). For example, such charge/discharge circuits may use 5.0 volt (V) transistors. Alternatively, such charge/discharge circuits may use low voltage transistors (i.e., transistors that are rated for low voltage operation). However, in this case, they tend to exhibit significant leakage depending on the voltage level of Vout and the specific operating mode.

Figure 1:
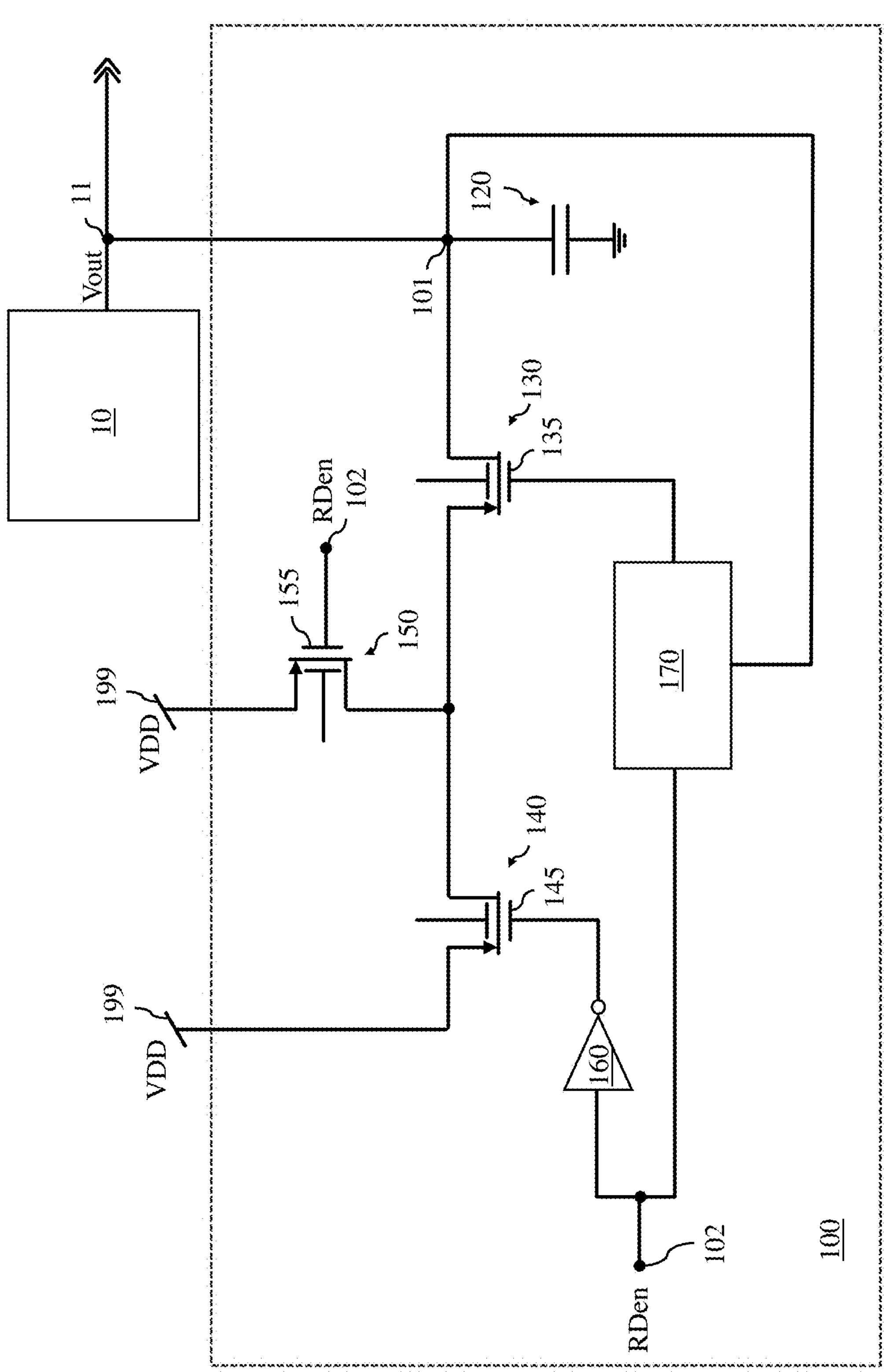
FIG. 1 is a schematic diagram illustrating an example of a charge/discharge circuit structure.

For example, FIG. 1 is a schematic diagram illustrating an example of a charge/discharge circuit structure (hereinafter referred to as structure 100). Structure 100 includes a first input node 101, which is connected to an output node 11 of a device 10 (e.g., a charge pump) to receive Vout, and a second input node 102, which is connected to receive a read mode enable signal (RDen). Structure 100 further includes a capacitor 120 connected between first input node 101 and ground. Structure 100 also includes: three low voltage P-type field effect transistors (i.e., a first, second, and third P-type field effect transistors (PFETs) 130, 140, 150); an inverter 160, and a voltage level shifter 170. First PFET 130 and third PFET 150 are connected in series between first input node 101 and a positive supply voltage node 199 at a positive supply voltage level (VDD). Second PFET 140 is connected in parallel with third PFET 150 between positive supply voltage node 199 and first PFET 130. Inverter 160 is connected between second input node 102 and a gate 145 of second PFET 140. A gate 155 of third PFET 150 is connected to second input node 102. Voltage level shifter 170 has input terminals connected to first input node 101 and second input node 102 and an output terminal connected to a gate 135 of first PFET 130.

For the example of structure 100 in FIG. 1, PFETs 130, 140, and 150 could be 1.8 V-PFETs, VDD could be at 1.8 V, RDen could be at 0.0 V during a read mode and at 1.8 V during various write modes, and Vout could range between 1.2 V to 3.6 V. In this configuration, if Vout is at 1.2 V when RDen is at 0.0 V (e.g., during a low voltage write mode), then a leakage path is created through third PFET 150 and first PFET 130. Specifically, under these conditions, second PFET 140 is in an OFF state but third PFET 150 is in an ON state. When third PFET 150 is turned on, the voltage level at the junction between the three PFETs will be pulled up to 1.8 V. Thus, the source voltage (Vs) of first PFET 130 will be at 1.8 V, the drain voltage (Vd) of first PFET 130 (received from the charge pump) will be at 1.2 V, and the gate voltage (Vg) of first PFET 130 (received from voltage level shifter 170) will also be at 1.2 V. As a result, first PFET 130 will be leaky, allowing leakage current to flow through both third PFET 150 and first PFET 130 and the amount of leakage current could be approximately 5.0 microamperes (μA) and worst case as high as 42 μA.

In view of the foregoing, disclosed herein are embodiments of a low leakage charge/discharge circuit structure for an output node (e.g., of a device, such as charge pump, which is included in a memory structure, such as in a resistive random access memory (RRAM) structure). This circuit structure can include, among other components: a positive supply voltage node at a positive supply voltage level; a first input node connected to an output node (e.g., of a charge pump) to receive a variable output voltage (Vout); and an N-type field effect transistor (NFET) and a first P-type field effect transistor (PFET) connected in series between the positive supply voltage node and the first input node. The gate of the NFET can be connected to the drain region of the first PFET (and thereby also the first input node). Thus, within the circuit structure, the NFET functions as a source follower NFET switch controlled by feedback from the drain region of the first PFET and thereby from Vout. By replacing the enable signal-controlled third PFET 150 in structure 100 (which is discussed above and illustrated in FIG. 1) with a feedback-controlled source follower NFET, the disclosed low leakage charge/discharge circuit structure exhibits relatively low leakage current when RDen is at 0.0 V and Vout is lower than the positive supply voltage level.

Figure 2:
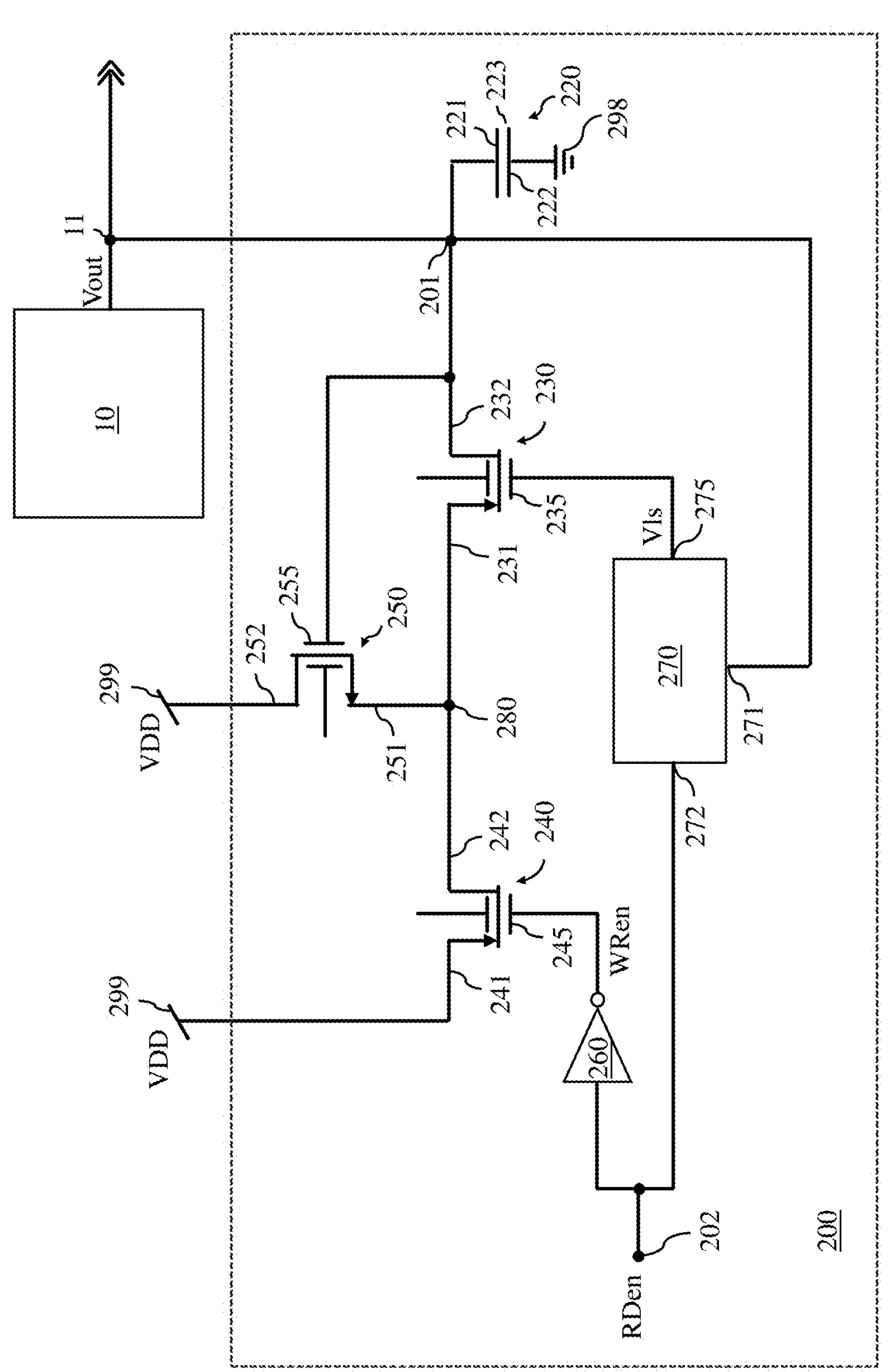
FIG. 2 is a schematic diagram illustrating disclosed embodiments of a charge/discharge circuit structure.

More particularly, FIG. 2 is a schematic diagram illustrating disclosed embodiments of a charge/discharge circuit structure (hereinafter referred to as structure 200).

Structure 200 can include a first input node 201. First input node 201 can be electrically connected to an output node 11 of a device 10. Device 10 can be some type of variable voltage generator. That is, device 10 can be configured to selectively generate and output a variable output voltage (Vout). For example, in some embodiments, device 10 can be a charge pump (e.g., for a memory structure, such as for an RRAM structure) and this charge pump can be configured to selectively generate and output a Vout on output node 11 at different operation-dependent voltage levels. For example, the voltage level of Vout can vary depending upon whether the operating mode of is one of various write modes (e.g., a forming mode, a programming mode, or an erasing mode) or a read mode. Such operating modes in an RRAM are known in the art and, thus, the details thereof have been omitted from this specification in order to allow the reader to focus on the salient aspects of the disclosed embodiments specifically related to the unique configuration of structure 200. However, in some embodiments, a charge pump, which has an output node 11 that is electrically connected to first input node 201, can be configured to output Vout at different voltage levels ranging from ~1.2 V or less to ~3.6 V or more. Optionally, the different voltage levels can vary by 100 millivolt (mV) steps. Such charge pumps are known in the art and, thus, the details thereof have been omitted from this specification in order to allow the reader to focus on the salient aspects of the disclosed embodiments related to the unique configuration of structure 200.

Structure 200 can further include a capacitor 220. Capacitor 220 can include a first capacitor plate 221, a second capacitor plate 222, and a capacitor dielectric 223 between the first capacitor plate 221 and the second capacitor plate 222. Capacitor 220 can, for example, be a 100 picofarad (pF) capacitor. Capacitor 220 can be connected between first input node 201 and ground 298. That is, first capacitor plate 221 can be electrically connected to first input node 201 and second capacitor plate 222 can be electrically connected to ground. Various different types of capacitors are well known in the art and could be incorporated into structure 200. Thus, specific details of such capacitors have been omitted from this specification in order to allow the reader to focus on the salient aspects of the disclosed embodiments (e.g., related to the inclusion within structure 200 of the feedback-controlled source follower NFET, as discussed in greater detail below).

Structure 200 can further include a positive supply voltage node 299 (also referred to herein as a positive supply voltage rail). Positive supply voltage node 299 can be continuously charged at a positive supply voltage level (VDD). In some embodiments, VDD can be 1.8 V.

Structure 200 can further include a second input node 202. Second input node 202 can be connected to another component (e.g., a controller (not shown)) to receive a first enable signal. When device 10 is a charge pump for a memory structure, such as a RRAM structure, this first enable signal can be a read enable signal (RDen). RDen can be at a positive supply voltage level (e.g., at VDD) during a read mode and at 0.0 V during any write mode.

Structure 200 can further include an N-type field effect transistor (NFET) 250 and a first P-type field effect transistor (PFET) 230, which are electrically connected in series between positive supply voltage node 299 and first input node 201. Structure 200 can also include a second PFET 240, which is electrically connected in parallel with NFET 250 between positive supply voltage node 299 and first PFET 230.

Each of these FETs 230, 240, 250 can have a relatively thin gate dielectric layer. That is, they can all be standard gate dielectric (SG) transistors as opposed to extra gate dielectric transistors with a relatively thick gate dielectric layer. Each of the FETs can have the same relatively low voltage rating. For example, they can be 1.8 volt (V) FETs. For example, each can have approximately the same maximum gate-to-source voltage (VGSmax), the same maximum gate-to-drain voltage (VGDmax), and the same maximum drain-to-source voltage (VDS) (e.g., of approximately 1.8 V, such as no greater than 1.98 V).

FETs 230, 240, and 250 can, for example, be implemented in an advanced semiconductor-on-insulator technology node. That is, they could be dual-gate fully-depleted semiconductor-on-insulator FETs (e.g., dual-gate fully-depleted silicon-on-insulator (FDSOI) FETs). Alternatively, they could be dual-gate partially-depleted semiconductor-on-insulator FETs (e.g., dual-gate partially-depleted silicon-on-insulator (PDSOI) FETs).

Figure 3:
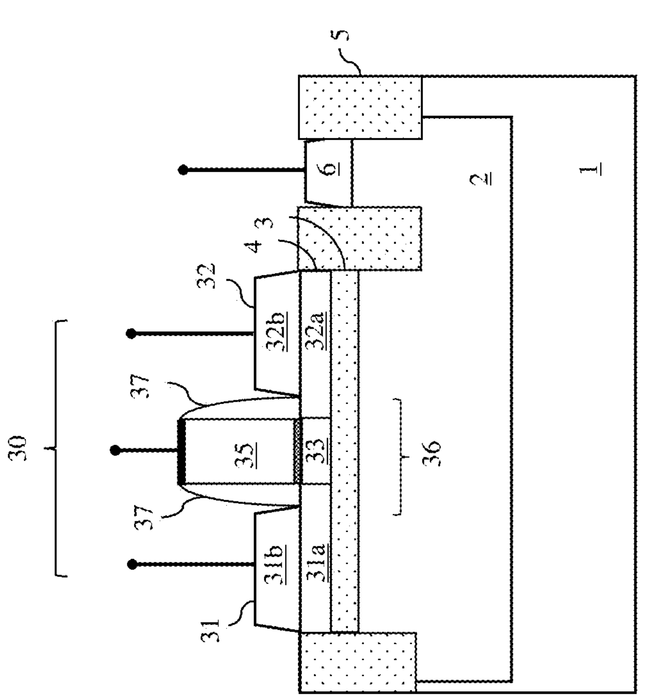
FIG. 3 is a cross-section diagram illustrating an example of a field effect transistor that can be incorporated into the structure of FIG. 2.

FIG. 3 is a cross-section diagram illustrating an example of a structure of a dual-gated FDSOI FET (hereinafter referred to as FET 30) that could be used for the FETs 230, 240, and 250 of structure 200. FET 30 can include a semiconductor substrate 1. Substrate 1 can be, for example, a monocrystalline silicon substrate or, alternatively, a monocrystalline substrate of any other suitable semiconductor material (e.g., silicon germanium, etc.). An insulator layer 3 can be on the top surface of semiconductor substrate 1. Insulator layer 3 can be, for example, a silicon dioxide layer or a layer of any other suitable insulator material. A semiconductor layer 4 can be on the top surface of insulator layer 3. Semiconductor layer 4 can be, for example, a monocrystalline silicon layer or a layer of any other suitable monocrystalline semiconductor material (e.g., silicon germanium, etc.).

Trench isolation regions 5 (e.g., shallow trench isolation (STI) structures) can define an active device region for FET 30 within semiconductor layer 4. Such STI structures can include, for example, one or more trenches patterned (e.g., lithographically) and etched so as to extend vertically from the top surface of semiconductor layer 4 to and, optionally, through insulator layer 3 and further so as to surround an active device region within semiconductor layer 4. The trench(es) can be filled with one or more layers of isolation materials (e.g., silicon dioxide, silicon nitride, silicon oxynitride, etc.), thereby forming the STI structures.

FET 30 can include, within its active device region, a channel region 33 positioned laterally between a source region 31 and a drain region 32. Those skilled in the art will recognize that, for an N-type field effect transistor (NFET), source/drain regions 31-32 can have N-type conductivity at a relatively high conductivity level (e.g., source/drain regions 31-32 can be N+ source/drain regions). For a P-type field effect transistor (PFET), source/drain regions 31-32 can have P-type conductivity at a relative high conductivity level (e.g., source/drain regions 31-32 can be P+ source/drain regions). In any case, source/drain regions 31-32 can include lower source/drain portions 31*a*-32*a* including doped regions of semiconductor layer 4 on either side of channel region 33. Optionally, source/drain regions 31-32 can further include upper source/drain portions 31*b*-32*b* (also referred to herein as raised source/drain regions) above and immediately adjacent to lower source/drain portions 31*a*-32*a*, respectively. Upper source/drain portions 31*b*-32*b* can include epitaxially grown monocrystalline semiconductor layers (e.g., epitaxially grown silicon layers). Channel region 33 can be a portion of semiconductor layer 4, which is positioned laterally between the source/drain regions 31-32. Channel region 33 can be intrinsic (i.e., undoped) or doped so as to have an opposite type conductivity as compared to source/drain regions 31-32. That is, for an NFET, channel region 33 could have P-type conductivity at a relatively low conductivity level (e.g., channel region 33 could be a P− channel region). For a PFET, channel region 33 could have N-type conductivity at a relatively low conductivity level (e.g., channel region 33 could be an N− channel region).

FET 30 can further include a front gate 35 (also referred to herein as a primary gate) adjacent to (e.g., above, and immediately adjacent to) the active device region at channel region 33. Front gate 35 can include a gate dielectric layer (including one or more layers of gate dielectric material) immediately adjacent to channel region 33 and a gate conductor layer (including one or more layers of gate conductor material) on the gate dielectric layer. Front gate 35 could be any of a gate-first polysilicon gate structure, a gate-first high-K metal gate (HKMG) structure, a gate-last HKMG structure (also referred to as a replacement metal gate (RMG) structure), or any other suitable type of front gate structure. Gate sidewall spacers 37 can further be positioned laterally adjacent to sidewalls of front gate 35 to electrically isolate it from the adjacent source/drain regions 31-32. Front gate structures with gate sidewall spacers are well known in the art and, thus, the details thereof have been omitted from the specification in order to allow the reader to focus on the salient aspects of the disclosed embodiments.

FET 30 can further include a back gate 36 (also referred to herein as a secondary gate). Specifically, semiconductor substrate 1 can include a well region 2 therein. Well region 2 can be located at the top surface of semiconductor substrate 2 immediately adjacent insulator layer 3 and can further be aligned below the active device region. For purposes of this disclosure, a well region refers to a region of semiconductor material doped (e.g., via a dopant implantation process or any other suitable doping process) so as to have a particular conductivity type.

Those skilled in the art will recognize that one advantage of advanced semiconductor-on-insulator technology processing platforms is that FETs can be formed on an insulator layer above either a particular type of well region (e.g., an N-type well region (Nwell) or a P-type well region (Pwell)) in order to achieve different types of NFETs or PFETs with different threshold voltages (VTs). For example, for a super low threshold voltage (SLVT) or low threshold voltage (LVT) FET, an NFET can be formed above an Nwell and a PFET can be formed above a Pwell. For a regular threshold voltage (RVT) or high threshold voltage (HVT) FET, an NFET can be formed above a Pwell and a PFET can be formed above an Nwell. In some embodiments of structure 200, all FETs can be SLVT or LVT FETs. Whether the FETs are SLVT or LVT FETs will depend upon the design (e.g., device size, etc.) and process specifications (e.g., dopant concentrations, etc.).

Another advantage of advanced semiconductor-on-insulator technology processing platforms is that portions of the insulator layer and well regions aligned below a FET effectively form a back gate, which can be biased (referred to as back gate biasing or back-biasing) to fine tune the threshold voltage. Forward back-biasing (FBB) refers to applying a gate bias voltage to the back gate (particularly, to the well region thereof) to reduce the VT of the FET. Reverse back-biasing (RBB) refers specifically to applying a gate bias voltage to the back gate (particularly, to the well region thereof) to increase the VT of the FET, thereby decreasing the switching speed and reducing leakage current. Thus, in FET 30, portions of insulator layer 3 and well region 2 aligned below channel region 33 effectively form back gate 36. To facilitate back gate biasing, FET 30 can include a well contact region 6 (also referred to herein as a well tap). Specifically, the structure can further include a bulk region (also referred to as a hybrid region). This bulk region can be devoid of insulator layer 3 and instead can include well contact region 6 at the top surface of semiconductor substrate 1 immediately adjacent to well region 2 and electrically isolated from the active device region of by STI structures. Well contact region 6 can include, for example, an epitaxial monocrystalline semiconductor layer (e.g., an epitaxial silicon layer or an epitaxial layer of any other suitable semiconductor material), which is grown on the top surface of semiconductor substrate 1 immediately adjacent to well region 2 and either in situ doped or subsequently implanted so as to have the same type conductivity (e.g., N-type conductivity) but at a higher conductivity level. Alternatively, well contact region 6 could be a highly doped region within and at the top surface of well region 2. Given the above-described structure, front gate 35 and back gate 36 of FET 30 can, optionally, be independently biased.

Alternatively, any other suitable FET structure, which is now known or later developed, could be employed for the various FETs of structure 200.

In any case, first PFET 230 (also referred to herein as PFET1) can include: a first source region 231; a first drain region 232; a first channel region between first source region 231 and first drain region 232; and at least a first gate 235 adjacent to the first channel region. First drain region 232 can be electrically connected to first input node 201. As discussed in greater detail below, first gate 235 is connected to receive a level-shifted voltage (Vls) output from a voltage level shifter 270.

Second PFET 240 (also referred to herein as PFET2) can include: a second source region 241, which is electrically connected to positive supply voltage node 299; a second drain region 242, which is electrically connected to first source region 231 of first PFET 230; a second channel region between second source region 241 and second drain region 242; and at least a second gate 245 adjacent to the second channel region. As discussed in greater detail below, second gate 245 is connected to receive a second enable signal (Wren) output from an inverter 260.

NFET 250 can include: a third drain region 252, which is electrically connected to positive supply voltage node 299; a third source region 251, which is electrically connected to second drain region 242 of second PFET 240 and also to first source region 231 of first PFET 230; a third channel region between third drain region 252 and third source region 251; and at least a third gate 255 adjacent to the third channel region and further electrically connected to first drain region 232 of first PFET 230 and also to first input node 201. Thus, NFET 250 is a source follower switch, which is effectively controlled by feedback from first drain region 232 of first PFET 230 and, thereby the Vout-dependent voltage level on first input node 201 (which is electrically connected to that first drain region 232). Thus, the drain voltage (Vd) at first drain region 232 controls the ON/OFF state of NFET 250.

It should be understood that, if structure 200 is implemented in an advanced semiconductor-on-insulator processing technology as discussed above, the first, second, and third gates 235, 245, and 255 of FETs 230, 240, and 250 will be front (primary) gates and that the FETs can also include back (secondary) gates. Although not discussed herein, it should be understood that back gate biasing could also be performed to enhance operation of structure 200.

Structure 200 can further include an inverter 260. Inverter 260 can be electrically connected between second input node 202 and second gate 245 of second PFET 240. Inverter 260 can have an input connected to receive the first enable signal from second input node 202, and configured to output a second enable signal (which is inverted relative to the first enable signal) to second gate 245. Inverter structures are known in the art. For example, an inverter can include a PFET and an NFET connected in series between a positive supply voltage node and ground. An inverter can further include an input terminal connected to gates of the PFET and NFET and an output terminal at the junction between the PFET and NFET. The input terminal can be electrically connected to receive an input signal (in this case RDen from second input node 202). The output terminal can output an output signal that is inverted with respect to the input signal. The PFET and NFET of inverter 260 can be rated the same as other FETs in structure 200 (e.g., they can be 1.8 V-FETs). As mentioned above, when device 10 is a charge pump for a memory structure, such as a RRAM structure, first enable signal can be a read enable signal (RDen). In this case, the second enable signal can be a write enable signal (WRen). Therefore, when, for example, RDen is at the positive voltage level during read mode operation, WRen will be at 0.0 V. When RDen is at 0.0 V during any write mode operation, WRen will be at VDD. WRen controls the ON/OFF state of second PFET 240.

Structure 200 can further include a voltage level shifter 270. Voltage level shifter 270 can have first and second input terminals 271-272, which are electrically connected to first input node 201 and second input node 202, respectively. Voltage level shifter 270 can further have an output terminal 275, which is electrically connected to first gate 235 of first PFET 230. This voltage level shifter 270 can be configured to output a level-shifted voltage (Vls) to first gate 235 of first PFET 230 based on Vout and RDen received at input terminals 271-272. For example, the voltage level of Vls can be equal to Vout when RDen is at 0.0 V and can be equal to 0.0 V when RDen is equal to VDD.

Figure 4:
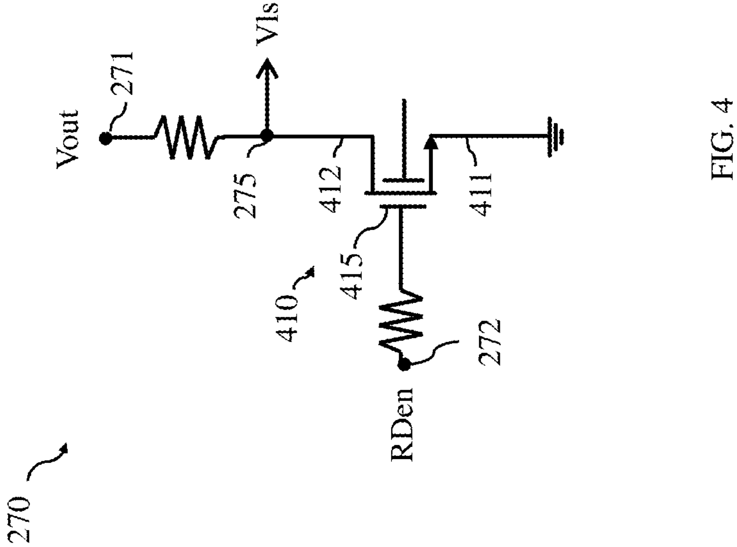
FIG. 4 is a schematic diagram illustrating an example of a voltage level shifter that can be incorporated into the structure of FIG. 2.

FIG. 4 is a schematic diagram illustrating just one example of a voltage level shifter 270 that could be incorporated into embodiments of structure 200. As illustrated, this voltage level shifter 270 can include an additional NFET 410. NFET 410 can be rated the same as other FETs in structure 200. For example, NFET 410 can be a 1.8 V-NFET. NFET 410 can include: a source region 411; a drain region 412; a channel region between source region 411 and drain region 412; and a gate 415 adjacent to the channel region. Source region 411 can be electrically connected to ground. Drain region 412 can be electrically connected (e.g., via a resistor) to first input terminal 271 (and thereby electrically connected to first input node 201 of structure 200) to receive Vout. Gate 415 can be electrically connected (e.g., via a resistor) to second input terminal 272 (and thereby electrically connected to second input node 202 of structure 200) to receive RDen. Output terminal 275 can be located at drain region 412 and, as mentioned above, can be electrically connected to first gate 235 of first PFET 230 of structure 200. In operation, if RDen is at 0.0 V, NFET 410 will be in an OFF state such that Vout will be maintained at output terminal 275, whereas if RDen is at 1.8 V, NFET 410 will switch to an ON state and output terminal 275 will be pulled down to ground (i.e., to 0.0 V).

As mentioned above, FIG. 4 illustrates just one example of a voltage level shifter that could be incorporated into structure 200. Alternatively, any other suitable type of voltage level shifter that is now known (e.g., a differential voltage level shifter) or later developed could be incorporated into structure 200.

Figure 6:
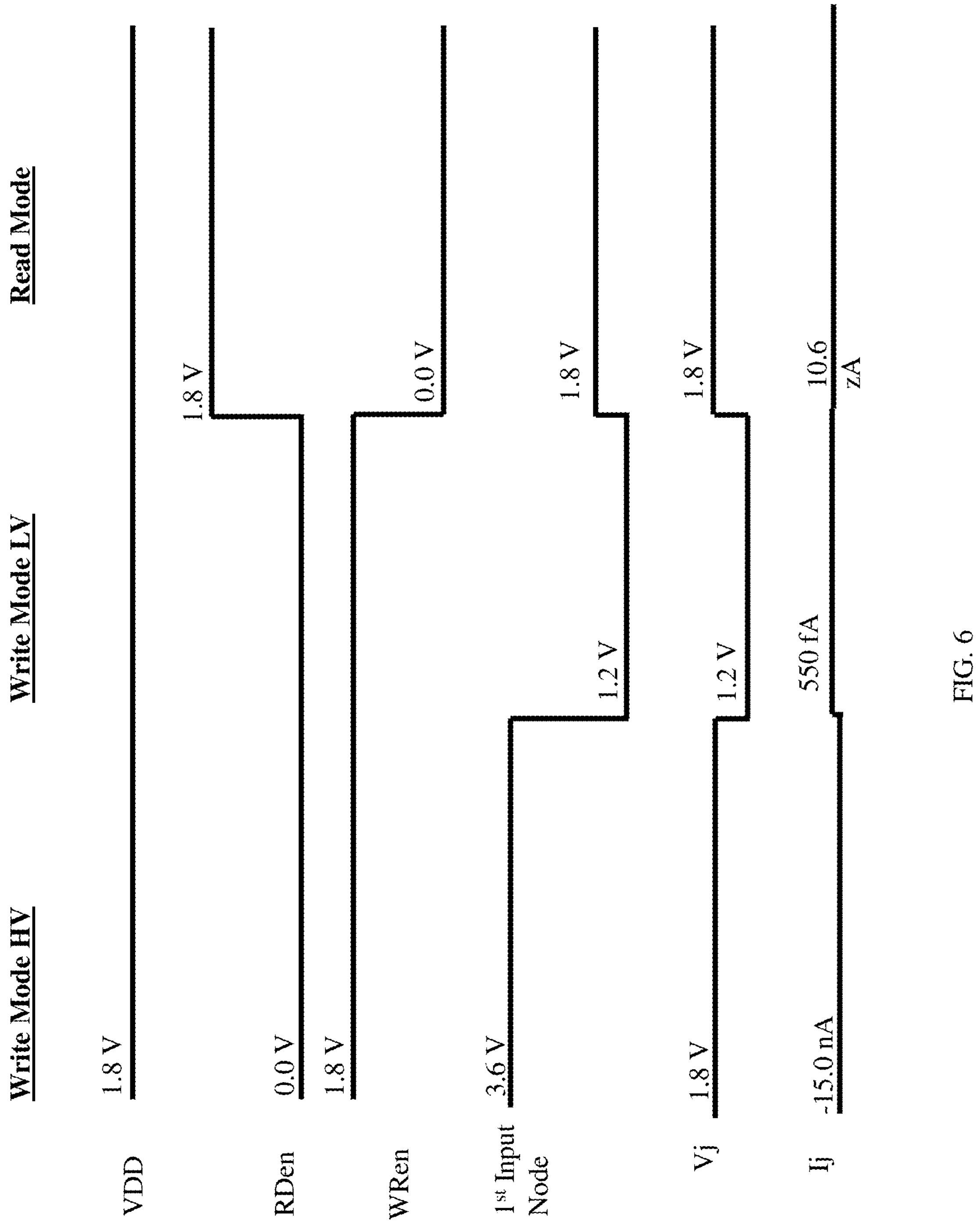

FIG. 5 is a table and FIG. 6 is a timing diagram each illustrating various electrical properties of structure 200 when all FETs are 1.8 V-FETs, when VDD is at 1.8 V, and when different Vout-RDen combinations are employed.

Referring to FIGS. 2, 5, and 6 in combination, write mode HV refers to operation of a memory structure in a particular write mode, which requires a relatively high Vout (e.g., Vout=3.6 V) to be output from a charge pump in order to complete the particular write operation and which requires RDen to be at 0.0 V. During this write mode HV, the voltage level on first input node 201 will be the same as Vout (i.e., 3.6 V). Thus, 3.6 V will be applied to the first input terminal 271 of voltage level shifter 270, 0.0 V will be applied to second input terminal 272 of voltage level shifter 270, and Vls output from output terminal 275 of voltage level shifter 270 will be at 3.6 V. Additionally, inverter 260 will receive RDen at 0.0 V and will output WRen at 1.8 V to second gate 245 of second PFET 240. Finally, 3.6 V will be applied to third gate 255 of NFET 250. Therefore, first PFET 230 and second PFET 240 will both be in OFF states and, while NFET 250 will be in an ON state, the voltage level (Vj) at the junction 280 between the three FETs 230, 240 and 250 will be pulled up to 1.8 V. Since the source voltage (Vs) on first source region 231 of first PFET 230 only rises to 1.8 V and, since the gate voltage (Vg) on first gate 235 of first PFET 230 is at 3.6 V, first PFET 230 will remain in the OFF state. In this case leakage current (e.g., as measured by the amount of current (Ij) through the junction 280 between the three FETs 230, 240, and 250) may be very low (e.g., ~−15.0 nanoamperes (nA)).

Similarly, write mode LV refers to operation of a memory structure in a different write mode, which requires a relatively low Vout (e.g., Vout=1.2 V) to be output from a charge pump in order to complete the particular write operation and which, like the write mode HV, requires RDen to be at 0.0 V. During this write mode LV, the voltage level on first input node 201 will be the same as Vout (i.e., 1.2 V). Thus, 1.2 V will be applied to the first input terminal 271 of voltage level shifter 270, 0.0 V will be applied to second input terminal 272 of voltage level shifter 270, and Vls output from output terminal 275 of voltage level shifter 270 will be at 1.2 V. Additionally, inverter 260 will receive RDen at 0.0 V and will output WRen at 1.8 V to second gate 245 of second PFET 240. Finally, 1.2 V will be applied to third gate 255 of NFET 250. Therefore, first PFET 230 and second PFET 240 will both be in OFF states. NFET 250 may be leaky but will only pull Vj at junction 280 up to 1.2 V. Since the source voltage (Vs) on first source region 231 of first PFET 230 only rises to 1.2 V and, since the gate voltage (Vg) on first gate 235 of first PFET 230 is also at 1.2 V, first PFET 230 will remain in the OFF state. In this case, Ij will still be relatively low (e.g., ~550 femtoamperes (fA) and worst case ~1 picoamperes (pA)). In other words, by replacing the enable signal-controlled third PFET 150 in the charge/discharge circuit structure 100, which is discussed above and illustrated in FIG. 1, with NFET 250 (a feedback-controlled source follower NFET), the disclosed low leakage charge/discharge circuit (i.e., structure 200 of FIG. 2) exhibits relatively low leakage current when RDen is 0.0 V and Vout is lower than VDD.

Although not illustrated, other write modes could require Vout to be output from the charge pump at other voltage levels lower than VDD (e.g., 1.3 V, 1.4 V, etc.). In any of these write modes, RDen will again be at 0.0 V and leakage current will be no greater than that seen with the lowest Vout of 1.2 V.

Finally, read mode refers to operation of a memory structure during which the charge pump 10 is turned off, RDen switches to 1.8 V, and structure 200 operates to charge the voltage level at output node 11 of device 10 to VDD (e.g., 1.8V). Specifically, during this read mode, inverter 260 will receive RDen at 1.8 V and will output WRen at 0.0 V to second gate 245 of second PFET 240 such that second PFET 240 switches to an ON state. Thus, Vj at junction 280 will be pulled up to 1.8 V. Additionally, since RDen is at 1.8 V, the output of voltage level shifter 270 will be at 0.0 V, thereby also switching first PFET 230 to an ON state. Thus, the voltage level on first input node 201 will also be pulled to up (i.e., charged) to 1.8 V and NFET 250 will be in an OFF state. In this case, Ij will be relatively high (e.g., ~10.6 zettaamperes (zA)) due to both the first and second PFETs 230 and 240 being conductive.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes,"

and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a positive supply voltage node at a positive supply voltage level;

a first input node connected to an output node of a device to receive a variable output voltage; and an N-type field effect transistor (NFET) and a first P-type field effect transistor (PFET) connected in series between the positive supply voltage node and the first input node, wherein a drain region of the NFET is connected to the positive supply voltage node, a source region of the NFET is connected to a source region of the first PFET, and a gate of the NFET is connected to a drain region of the first PFET.

2. The structure of claim 1, further comprising: a second PFET connected in parallel with the NFET between the positive supply voltage node and the first PFET; and a capacitor connected between the first input node and ground.

3. The structure of claim 2, wherein the first PFET, the second PFET, and the NFET have a same voltage rating.

4. The structure of claim 2, further comprising a second input node connected to receive an enable signal.

5. The structure of claim 4, further comprising: a voltage level shifter having two input terminals connected to the first input node and to the second input node, respectively, wherein the voltage level shifter further has an output terminal connected to a gate of the first PFET and outputs a level-shifted voltage to the gate of the first PFET based on the variable output voltage and the enable signal.

6. The structure of claim 5, wherein a voltage level of the level-shifted voltage is equal to the variable output voltage when the enable signal is 0.0 volts (V) and equal to 0.0 V when the enable signal is equal to the positive supply voltage level.

7. The structure of claim 5, wherein the voltage level shifter includes an additional NFET with a drain region connected to the first input node, a gate connected to the second input node, and a source region connected to ground, and wherein the output terminal is at the drain region.

8. The structure of claim 4, further comprising an inverter connected between the second input node and a gate of the second PFET.

9. The structure of claim 1, wherein the device is a charge pump, and wherein voltage levels of the variable output voltage range from below the positive supply voltage level to above the positive supply voltage level.

10. The structure of claim 1, wherein the NFET is a source follower switch controlled by feedback from the drain region of the first PFET and the first input node.

11. A structure comprising:

a positive supply voltage node at a positive supply voltage level;

a first input node connected to an output node of a charge pump to receive a variable output voltage;

an N-type field effect transistor (NFET) and a first P-type field effect transistor (PFET) connected in series between the positive supply voltage node and the first input node, wherein a gate of the NFET is connected to a drain region of the first PFET;

a second PFET connected in parallel with the NFET between the positive supply voltage node and the first PFET; and a capacitor connected between the first input node and ground.

12. The structure of claim 11, wherein the first PFET, the second PFET, and the NFET are 1.8-volt (V)-transistors and the positive supply voltage level is 1.8 V.

13. The structure of claim 12, further comprising a second input node connected to receive a first enable signal, wherein the first enable signal switches between 0.0 V and 1.8 V.

14. The structure of claim 13, further comprising: a voltage level shifter having two input terminals connected to the first input node and to the second input node, respectively, wherein the voltage level shifter further has an output terminal connected to a gate of the first PFET and outputs a level-shifted voltage to the gate of the first PFET based on the variable output voltage and the first enable signal.

15. The structure of claim 14, wherein a voltage level of the level-shifted voltage is equal to the variable output voltage when the first enable signal is 0.0 volts (V) and equal to 0.0 V when the first enable signal is equal to the positive supply voltage level.

16. The structure of claim 14, wherein the voltage level shifter includes an additional NFET with a drain region connected to the first input node, a gate connected to the second input node, and a source region connected to ground, and wherein the output terminal is at the drain region.

17. The structure of claim 13, further comprising an inverter connected between the second input node and a gate of the second PFET, wherein the inverter outputs a second enable signal to the gate of the second PFET and wherein the second enable signal is inverted relative to the first enable signal.

18. The structure of claim 11, wherein voltage levels of the variable output voltage range from 1.2 V to 3.6 V.

19. The structure of claim 11, wherein the NFET is a source follower switch controlled by feedback from the drain region of the first PFET and the first input node.

20. A structure comprising:

a positive supply voltage node at a positive supply voltage level;

a first input node connected to an output node of a charge pump to receive a variable output voltage from the charge pump;

a second input node connected to receive a first enable signal;

an N-type field effect transistor (NFET) and a first P-type field effect transistor (PFET) connected in series between the positive supply voltage node and the first input node, wherein a gate of the NFET is connected to a drain region of the first PFET;

a second PFET connected in parallel with the NFET between the positive supply voltage node and the first PFET;

a capacitor connected between the first input node and ground;

a voltage level shifter having two input terminals connected to the first input node and to the second input node, respectively, and an output terminal connected to a gate of the first PFET, wherein the voltage level shifter outputs a level-shifted voltage to the gate of the first PFET based on the variable output voltage and the first enable signal; and an inverter connected between the second input node and a gate of the second PFET, wherein the inverter is configured to output a second enable signal to the gate of the second PFET and wherein the second enable signal is inverted relative to the first enable signal.

* * * * *